(12) United States Patent
Wang et al.

(10) Patent No.: US 8,345,396 B2
(45) Date of Patent: Jan. 1, 2013

(54) ELECTROSTATIC DISCHARGE PROTECTORS HAVING INCREASED RC DELAYS

(75) Inventors: Shih-Yu Wang, Taipei (TW); Chia-Ling Lu, Luzhou (TW); Yu-Lien Liu, Hsinchu (TW); Yan-Yu Chen, Taipei (TW); Che-Shih Lin, Sinfong Township, Hsinchu County (TW); Tao-Cheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 242 days.

(21) Appl. No.: 12/719,577

(22) Filed: Mar. 8, 2010

(65) Prior Publication Data

US 2011/0216454 A1 Sep. 8, 2011

(51) Int. Cl.
*H02H 3/22* (2006.01)

(52) U.S. Cl. .......................................... 361/58; 361/111

(58) Field of Classification Search ................ 361/56, 361/111
See application file for complete search history.

(56) References Cited

U.S. PATENT DOCUMENTS

| | | | |
|---|---|---|---|
| 6,400,540 B1 | 6/2002 | Chang | |
| 7,102,862 B1 | 9/2006 | Lien et al. | |
| 7,154,719 B2 | 12/2006 | Krasin | |
| 7,245,466 B2* | 7/2007 | Steinhoff | 361/56 |
| 7,405,915 B2* | 7/2008 | Choi | 361/56 |
| 7,495,878 B2* | 2/2009 | Todd | 361/111 |
| 7,746,609 B2* | 6/2010 | Kim | 361/56 |
| 2007/0091530 A1 | 4/2007 | Chen | |

FOREIGN PATENT DOCUMENTS

| | | |
|---|---|---|
| TW | 437093 B | 5/2001 |
| TW | 485599 | 5/2002 |

* cited by examiner

*Primary Examiner* — Danny Nguyen

(74) *Attorney, Agent, or Firm* — Stout, Uxa, Buyan & Mullins, LLP

(57) ABSTRACT

An RC delay circuit for providing electrostatic discharge (ESD) protection is described. The circuit employs an NMOS transistor and a PMOS transistor to produce a large effective resistance using a relatively small circuit layout area.

20 Claims, 6 Drawing Sheets

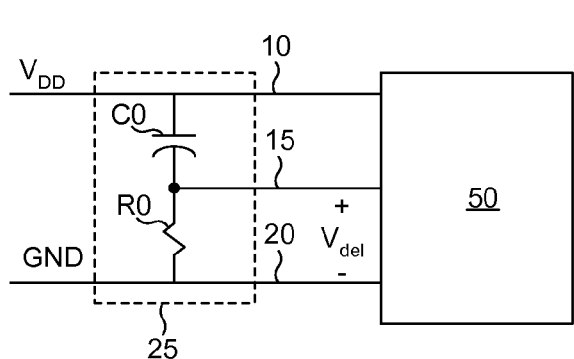
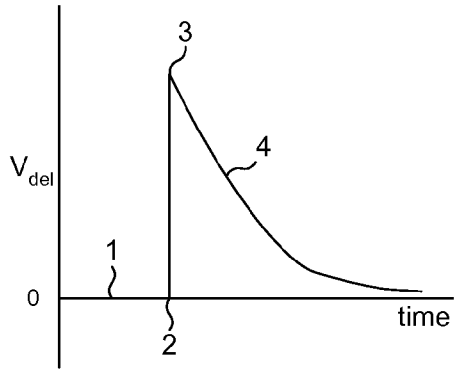
FIG. 1A
FIG. 1AA
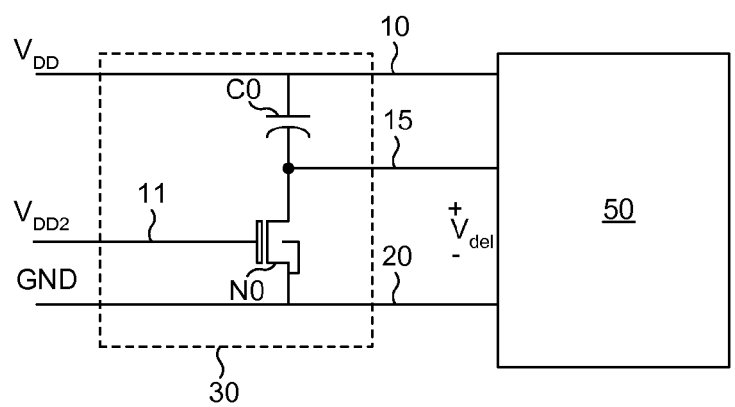
FIG. 1B
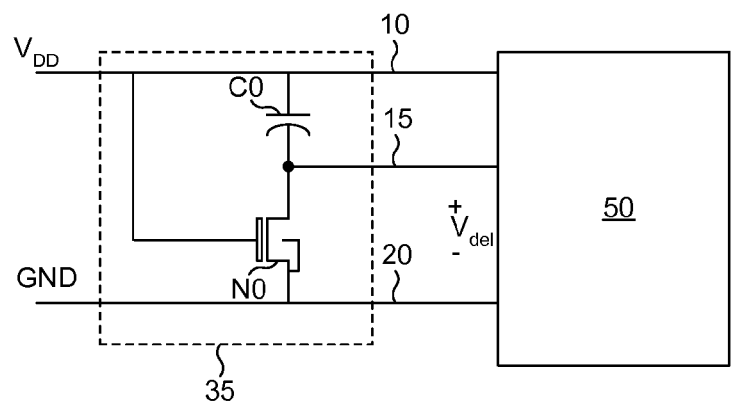
FIG. 1C

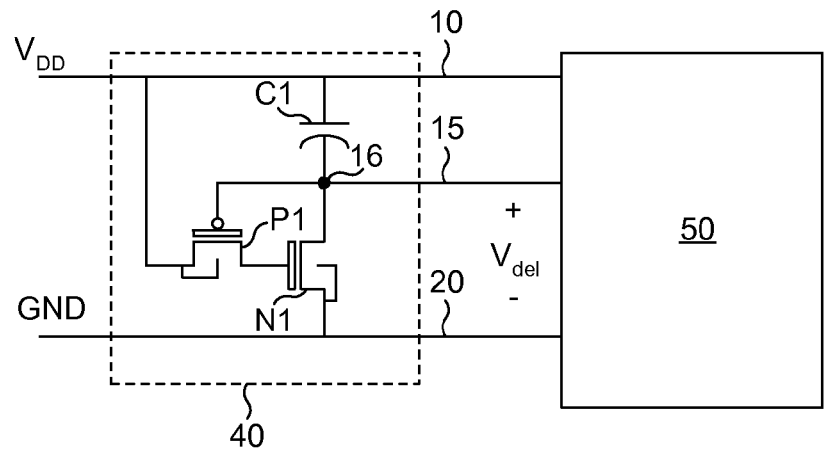
FIG. 2
FIG. 3  FIG. 4
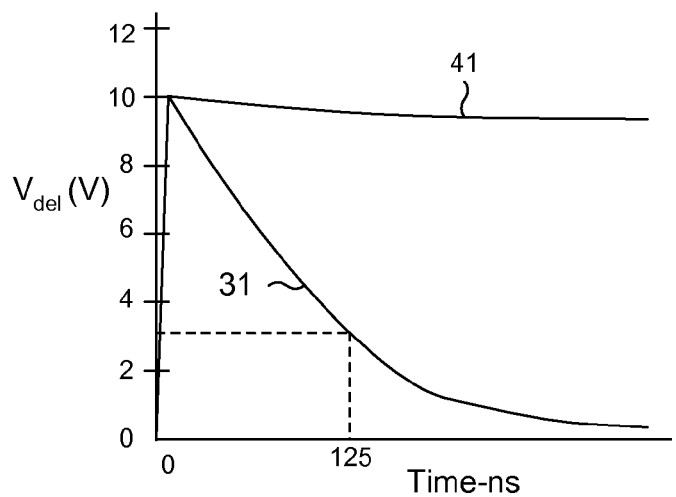
FIG. 5A

ELECTROSTATIC DISCHARGE PROTECTORS HAVING INCREASED RC DELAYS

BACKGROUND OF THE INVENTION

1. Field of the Invention

The present invention relates generally to integrated circuits and, more particularly, to protection of integrated circuits from electrostatic discharge.

2. Description of Related Art

Electrostatic discharge (ESD) is a known cause of failure of integrated circuit devices. Large electrostatically generated voltages can result from human handling of chip-level and even board-level circuits. Reliability of such circuits can be improved by including ESD protectors as part of the circuit design.

ESD frequently is presented on a power supply terminal such as a voltage supply line of a circuit. Although ESD voltages may be quite large, they tend to be characterized by very short rise- and fall-times so that an ESD protector may not be able to respond directly to a "zap" from an ESD source. Accordingly, an RC delay circuit may be connected to the voltage supply line of a device in order to provide the ESD protector time to respond to an ESD event, typically by momentarily shunting the drain supply line to ground.

Fabrication of a resistor in an integrated circuit forces an inefficient trade-off between resistor value and use of chip area, large resistance being required to achieve large delay, and large chip area being required to implement large resistance. Accordingly, some prior-art attempts to create a delay circuit for an ESD protector have substituted a transistor for a resistor in an RC circuit. However, the effective resistance of a transistor may be rather small, so that it is difficult to create a large delay following this approach.

A need thus exists in the prior art for a simple and effective RC circuit implementation for an ESD protector which is both efficient in its use of chip area and is capable of providing a significant RC delay.

SUMMARY OF THE INVENTION

An embodiment of the present invention addresses this need by providing an electrostatic discharge (ESD) protector that includes a novel RC delay circuit employing two transistors. An embodiment of the invention herein disclosed comprises a capacitor having a terminal, the terminal being connected to a node. The embodiment comprises a first transistor having a drain terminal connected to the node and a second transistor having a gate terminal connected to the node. According to one embodiment, the terminal of the capacitor is a second terminal and the capacitor further comprises a first terminal connected to a voltage supply line. The first transistor comprises a source terminal connected to a reference voltage line, the second transistor comprises a source terminal connected to the voltage supply line, and the node is connected to an output voltage line.

According to another embodiment, the first transistor comprises a source terminal connected to a reference voltage line, and the delay circuit is arranged, configured, and operational according to the following during normal operation: the second transistor being in an ON state, the first transistor being in an ON state, a voltage on the source of the second transistor being about equal to the voltage of the reference voltage line, and a voltage on the node being about zero.

According to yet another embodiment, the first transistor comprises a source terminal connected to a reference voltage line, the second transistor comprises a source terminal connected to a voltage supply line, and the delay circuit is arranged, configured and operational according to the following when an ESD voltage zaps the voltage supply line: the gate of the second transistor being momentarily coupled to the voltage supply line, the second transistor being turned OFF, the gate of the first transistor floating thereby increasing an effective resistance between the drain and source terminals of the first transistor, and a trigger signal being generated on the node relative to the voltage reference line, the trigger signal having an approximate form of a decaying exponential function with a time constant equal to a product of the capacitance of the capacitor and the effective resistance of the first transistor.

While the apparatus and method has or will be described for the sake of grammatical fluidity with functional explanations, it is to be expressly understood that the claims, unless indicated otherwise, are not to be construed as necessarily limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE FIGURES

FIG. 1A is a simplified schematic diagram of an RC delay circuit;

FIG. 1AA is a chart illustrating a typical waveform generated in the circuit of FIG. 1A in response to large, positive, very short ESD pulse;

FIG. 1B is a schematic diagram of another RC delay circuit utilizing an N-channel Metal-Oxide-Semiconductor (NMOS) transistor;

FIG. 1C is a schematic diagram of another RC delay circuit utilizing an NMOS transistor;

FIG. 2 shows an RC delay circuit utilizing an NMOS transistor and a P-channel Metal-Oxide-Semiconductor (PMOS) transistor according to an embodiment of the present invention;

FIG. 3 is a schematic diagram illustrating naming conventions used for terminals of an NMOS transistor;

FIG. 4 is a schematic diagram illustrating naming conventions used for terminals of a PMOS transistor;

FIG. 5A is a chart illustrating relative delay times of the embodiments shown in FIGS. 1C and 2;

DETAILED DESCRIPTION OF THE PRESENTLY PREFERRED EMBODIMENTS

Figure 5B:
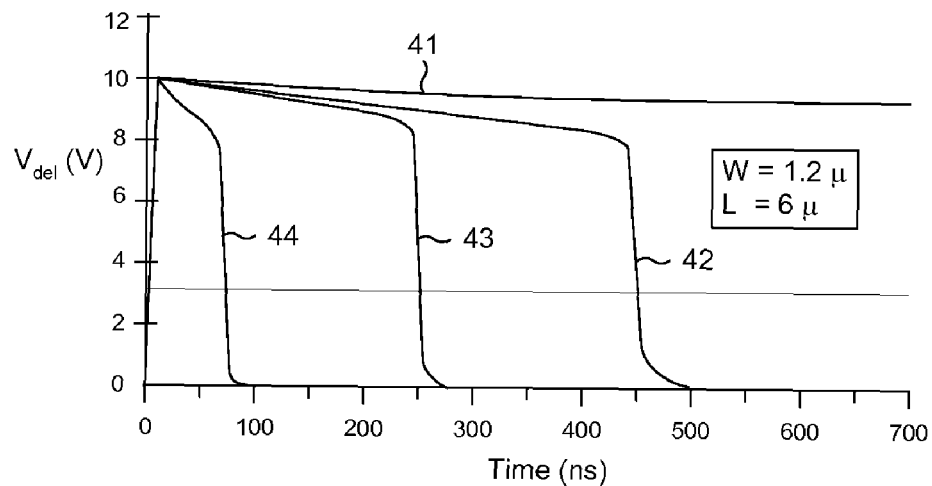
FIG. 5B is a chart illustrating delay times achieved by the embodiment shown in FIG. 2 for one set of transistor parameters.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not presumed, automatically, to be to precise scale in all embodiments. That is, they are intended to be examples of implementations of various aspects of the present invention and, according to certain but not all embodiments, to be to-scale. While, according to certain implementations, the structures depicted in these figures are to be interpreted to be to scale, in other implementations the same structures should not. In certain aspects of the invention, use of the same reference designator numbers in the drawings and the following description is intended to refer to similar or analogous, but not necessarily the same, components and elements. According to other aspects, use of the same reference designator numbers in these drawings and the following description is intended to be interpreted as referring to the same or substantially the same, and/or functionally the same, components and elements. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent accompanying this disclosure is to discuss exemplary embodiments with the following detailed description being construed to cover all modifications, alternatives, and equivalents of the embodiments as may fall within the spirit and scope of the invention as defined by the appended claims. It is to be understood and appreciated that the process steps and structures described and referenced herein do not cover a complete procedure for the design of the disclosed and referenced circuits. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to circuits for protecting integrated circuits from effects of electrostatic discharge.

FIG. 1A illustrates an example of an RC delay circuit 25 in the form of a resistor R0 and a capacitor C0 connected in series between a voltage supply line 10 and ground 20. The voltage supply line 10 typically is held at a nominal voltage level $V_{DD}$ by a power supply (not shown). A delayed output voltage $V_{del}$, measured from a connection point between the resistor R0 and the capacitor C0, triggers an ESD protector in the form of an ESD protection circuit 50. A typical $V_{del}$ waveform generated by the circuit of FIG. 1A in response to a sudden positive ESD voltage (i.e., a step) applied to the voltage supply line 10 relative to ground 20 is illustrated in FIG. 1AA. During a normal-operation time interval 1, no current flows in resistor R0, and $V_{del}$ is zero. When an ESD zap is applied at a time 2, the capacitor C0 appears as a short, and all of the ESD voltage (having a peak designated by 3 in FIG. 1AA) appears across the resistor R0. Subsequently, capacitor C0 charges toward the ESD voltage, and current in the resistor R0 decays toward zero with a time constant of R0×C0 as indicated by a segment 4 of the $V_{del}$ waveform. The output voltage, $V_{del}$, therefore, is "stretched out" in response to the ESD zap, giving the ESD protection circuit 50 time to respond to the ESD event.

A circuit of the type represented by FIG. 1A may be practical for use in board-level circuits where the physical size of components is a relatively unimportant consideration. For size-sensitive applications, however, the significant area required for fabrication of such resistive components in an integrated circuit may be unacceptable.

FIG. 1B shows an RC delay circuit 30 representative of a modification to the circuit of FIG. 1A with the resistor R0 (FIG. 1A) being replaced with an N-channel Metal-Oxide-Semiconductor (NMOS) transistor N0 and a second supply $V_{DD2}$ line 11 coupled to a gate thereof to control operation of the RC delay circuit 30. When $V_{DD2}$ is zero the transistor N0 is OFF in which case the transistor N0 simulates a very large resistor, and the RC delay may be large. In normal operation, a supply voltage is applied $V_{DD}$, and a voltage is applied to $V_{DD2}$ that causes the transistor N0 to be ON, resulting in a small effective resistance. When an ESD zap occurs on $V_{DD}$, $V_{DD2}$ becomes floating and is close to zero volts, causing the transistor N0 to be nearly OFF, thereby increasing the effective resistance and increasing the RC delay.

FIG. 1C shows a similar delay circuit 35 in which a separate $V_{DD2}$ is not available. In this case, the transistor N0 gate is tied to $V_{DD}$, which causes the transistor N0 to be ON during ESD zapping, thereby (undesirably) reducing RC delay time relative to the RC delay time of the circuit in FIG. 1B. Thus, in these examples, the reduction in chip area resulting from replacing resistor R0 (FIG. 1A) with transistor N0 is obtained at a cost of a smaller value of effective resistance at the location of the resistor R0 in the circuit (cf. FIGS. 1B and 1C). Consequently, only a relatively small RC delay can be obtained with those circuits.

Turning to FIG. 2, a simplified schematic diagram of a delay circuit 40 according to an arrangement of an embodiment of the present invention is elucidated in a configuration for causing triggering of an electrostatic discharge (ESD) protector such as an ESD protection circuit 50. In FIG. 2, the resistor R0 (FIG. 1A) is replaced in with a transistor N1, which may be, for example, an N-channel Metal-Oxide-Semiconductor (NMOS) transistor. The illustrated embodiment may be suitable for implementation in an integrated circuit environment. As used herein, terminals of NMOS transistors are referred to as N-source, N-drain, N-gate, and N-well (or N-substrate) terminals as reflected in FIG. 3. In FIG. 3, ND denotes the N-drain, NG the N-gate, and so on. The N-well of the transistor N1 of FIG. 2 is connected to the N-source thereof.

The circuit of FIG. 2 illustrates, as one example, a voltage supply line 10 and a reference voltage line 20, which may be referred to as a ground line, the voltage supply line 10 being susceptible to ESD. Parts of the circuit can be connected in a manner similar to the connections shown in FIG. 1A with a capacitor C1 having a first terminal connected to the voltage supply line 10 and a second terminal connected to an output line 15. However, the terminals of the resistor in FIG. 1A are replaced by the N-drain and N-source terminals of the transistor N1, the N-drain terminal being connected to the output line 15, and the N-source terminal being connected to the ground line 20.

The embodiment of FIG. 2 further comprises a P-channel Metal-Oxide-Semiconductor (PMOS) transistor P1. This transistor P1 has terminals referred to herein as a P-source, a P-drain, a P-gate, and a P-well, which naming conventions are summarized in FIG. 4. The transistor P1 is disposed in the delay circuit 40 with its P-drain connected to the N-gate of the transistor N1 and its P-source connected to the voltage supply line 10. The P-gate of the transistor P1 connects to a node 16 formed by connecting the output line 15, the N-drain of the transistor N1, and the second terminal of the capacitor C1. The P-well terminal of the transistor P1 is connected to the P-source.

Immediately upon an ESD zap voltage (e.g., a very large positive voltage pulse or "zap") appearing on voltage supply line 10, the P-source and P-well of transistor P1 are coupled to the voltage supply line 10 and capacitor C1 functions as a momentary short, thereby momentarily coupling the P-gate of transistor P1 to the voltage supply line 10 so that the gate-to-source voltage of transistor P1 is zero and transistor P1 is turned OFF. Accordingly, the N-gate of transistor N1 is floating, and an effective resistance between the N-drain and N-source terminals of the transistor N1 is increased relative, for example, to the effective resistance of the transistor N0 in FIG. 1C. In one embodiment, the effective RC delay time is increased by a factor of about three when compared to the implementation of FIG. 1C. The delay circuit 40 (FIG. 2) thereby generates a trigger signal on the output line 15, the trigger signal appearing, in a typical embodiment, as a decaying exponential voltage function having a time constant equal to a product of the capacitance of the capacitor C1 and the effective resistance of the N-source/N-drain connection of the transistor N1. The cost of the larger delay factor is quite small, equaling, approaching or not much more than the layout area needed for the transistor P1.

During normal operation, capacitor C1 appears as an open circuit, and the P-gate of the transistor P1 may be assumed to be floating. However, the P-well of transistor P1 is biased to $V_{DD}$ so that transistor P1 is ON, effectively connecting the N-gate of transistor N1 to $V_{DD}$. The transistor N1 therefore is ON so that the P-gate of transistor P1 actually is pulled to ground, consistent with the assumption that transistor P1 is ON. In this condition about zero volts is present on the output voltage line 15.

In comparing the embodiment illustrated in FIG. 2 with that of FIG. 1C, the transistor N0 (FIG. 1C) has its N-gate connected to $V_{DD}$ and is therefore ON when a "zap" from an ESD source occurs, which results in only a small resistance between the N-source and N-drain and hence a small RC delay. On the other hand, the transistor N1 (FIG. 2) can exhibit a significantly larger effective resistance during an ESD zap as a consequence of the N-gate being in a floating condition.

FIG. 5A is a chart quantifying relative performances of the embodiments illustrated in FIGS. 1C and 2. The waveforms on the chart are those that occur immediately after an ESD zap has occurred. A first curve 31 in the figure illustrates a characteristic of the delay circuit 35 of FIG. 1C. It may be observed that about 125 ns of time elapses while a value of the output voltage $V_{del}$ decreases from about 10 volts to about 3.3 volts in that case. A second curve 41 characterizes (i.e., exemplifies) operation of the delay circuit 40 in the embodiment of FIG. 2. The resulting delay may be noted to represent a large improvement relative to the implementation of FIG. 1C. In particular, the first curve 31, representing the prior-art implementation of FIG. 1C, employs a capacitor C1 having a value of about 5 pf and a transistor N0 having a width of 1.2 μm and a length of about 6 μm. The resulting time constant is about 125 ns, which represents an effective resistance value of about 25 K ohms. The second curve 41 describes an implementation using the same 5 pf capacitor C1 and transistor N1 (FIG. 2) also having a width of about 1.2 μm and a length of about 6 μm. As described below with reference to FIG. 10A, the delay of curve 41 exceeds 1600 ns. Accordingly, the effective resistance represented by the second curve 41 is greater than 320 K ohms, which exceeds that of the implementation of FIG. 1C by at least an order of magnitude.

Figure 5C:
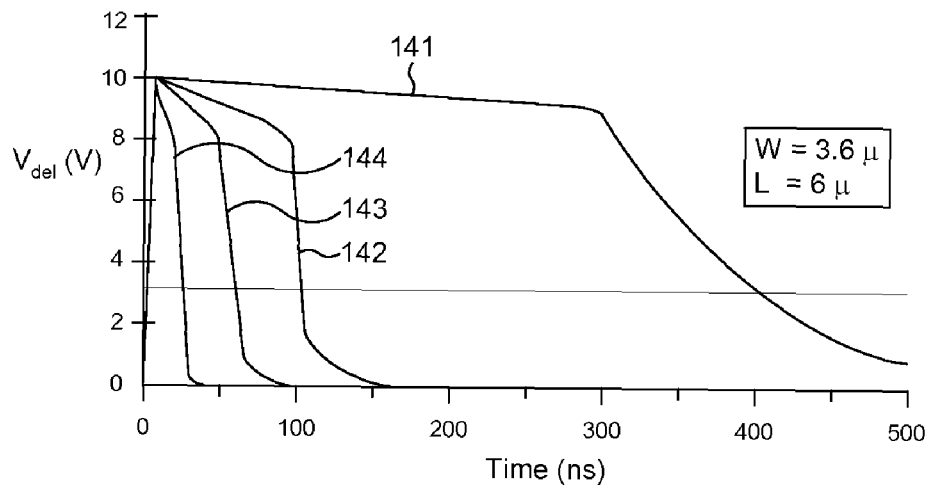
FIG. 5C is a chart illustrating delay times achieved by the embodiment shown in FIG. 2 for another set of transistor parameters.

FIGS. 5B and 5C are charts that, in conjunction with Table 1 below, depict effects of parametric variations in exemplary embodiments of the present invention. Table 1 includes effects of length and width of transistor P1 in FIG. 2 as well as an effect of changing values of capacitor C1 in FIG. 2. To summarize, reference designators 42, 43, 44, 142, 143, and 144, on curves in FIGS. 5B and 5C and of corresponding entries in Table 1, illustrate effects of changing values of C1 in FIG. 2. It may be noted that RC delay time can be adjusted by changing a size of a capacitor and by varying length/width parameters of an MOS transistor. Effective resistance, $R_{eff}$ in Table 1 is calculated by dividing a measured time constant ($R_{eff} \times C1$) in the figures by C1. Curves 41 and 141 of FIGS. 5B and 5C demonstrate an effect of changing a width parameter on the transistors in the delay circuit 40 of FIG. 2. In particular, with a length of 6 μm, a width of 1.2 μm provides a larger effective resistance than does a width of 3.6 μm. The ESD in FIGS. 5B and 5C is modeled as a 10-volt pulse applied at time=0 with a rise-time of 10 ns.

TABLE 1

| Ref. Desig. | Length (μm) | Width (μm) | C1 (pf) | $R_{eff} \times C1$ | $R_{eff}$ (kΩ) |
|---|---|---|---|---|---|
| 41 | 6 | 1.2 | 5 | >500 | >100 |
| 42 | 6 | 1.2 | 1 | 450 | 450 |
| 43 | 6 | 1.2 | 0.5 | 251 | 502 |
| 44 | 6 | 1.2 | 0.1 | 73 | 730 |
| 141 | 6 | 3.6 | 5 | 398 | 80 |
| 142 | 6 | 3.6 | 1 | 102 | 102 |
| 143 | 6 | 3.6 | 0.5 | 60 | 120 |
| 144 | 6 | 3.6 | 0.1 | 23 | 230 |

Figure 6:
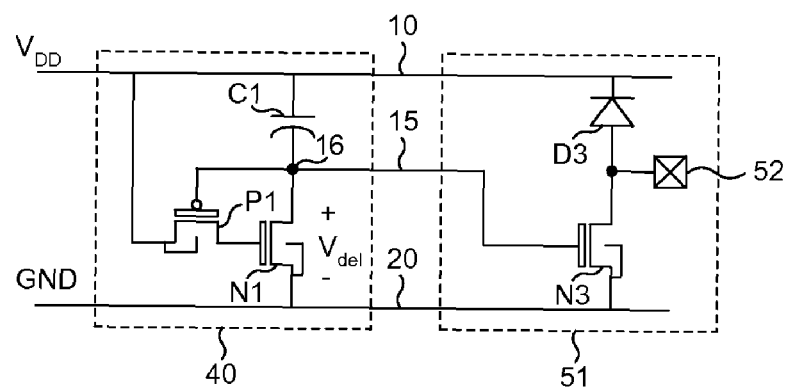
FIG. 6 is a schematic diagram of the embodiment illustrated in FIG. 2 applied in conjunction with a protection circuit for an input bonding PAD.
Figure 7:
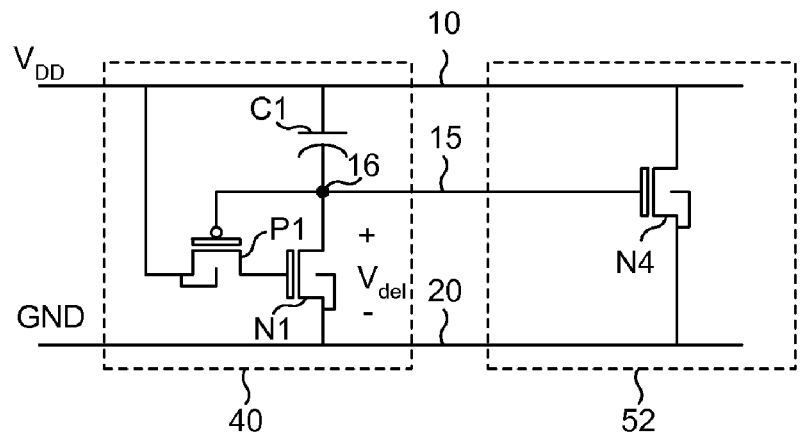
FIG. 7 is a schematic diagram of the embodiment of FIG. 2 applied in conjunction with a type of power/ground NMOS ESD protection circuit.
Figure 8:
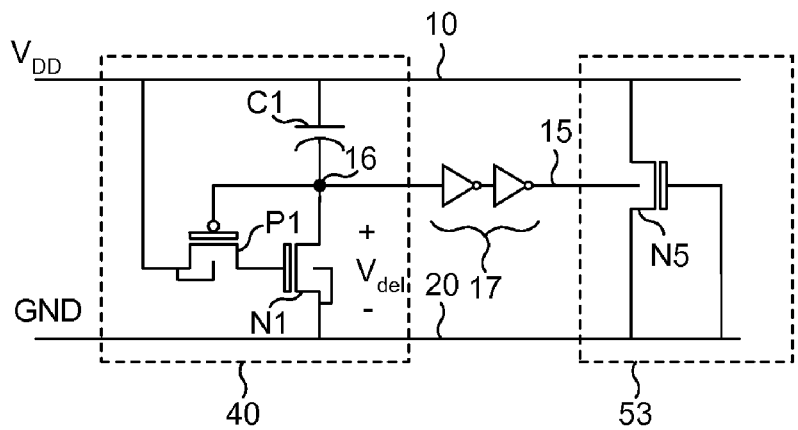
FIG. 8 is a schematic diagram of the embodiment of FIG. 2 applied in conjunction with another type of power/ground NMOS ESD protection circuit.

FIGS. 6, 7 and 8 illustrate applications of the RC delay circuit 40 (FIG. 2) to several types of ESD protection circuits. For example, in FIG. 6, the RC delay circuit 40 is employed in association with an embodiment of an input PAD protection circuit 51. That is, the RC delay circuit 40 and the input PAD protection circuit 51 may provide ESD protection on a bond-wire connection between an external pin of an integrated circuit package and a bonding PAD 52 on an integrated circuit die. In FIG. 7, the same RC delay circuit 40 is paired with an embodiment of a power/ground NMOS ESD protection circuit 52 employing an NMOS transistor N4. FIG. 8, in which the voltage $V_{del}$ is coupled to the output line 15 through a pair (or alternatively, another even number) of inverters 17 that may provide pulse shaping, depicts use of the RC delay circuit 40 with an embodiment of an NMOS substrate pump ESD protection circuit 53 that includes an NMOS transistor N5.

Figure 9:
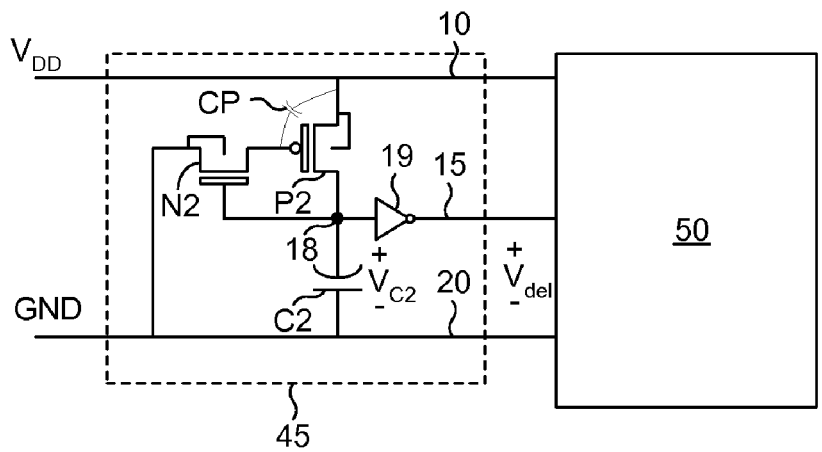
FIG. 9 shows an RC delay circuit utilizing a NMOS transistor and a PMOS transistor according to another embodiment of the present invention.

FIG. 9 is a schematic diagram of another arrangement of an RC delay circuit 45 that employs a PMOS transistor P2 having terminals as described above with reference to FIGS. 2 and 4 and an NMOS transistor N2 with terminals as described above with reference to FIGS. 2 and 3. The embodiment includes a capacitor C2, a second terminal of which is connected to the P-drain of transistor P2 to form a node 18. A first terminal of capacitor C2 connects to ground; a voltage $V_{C2}$ appears across capacitor C2. The P-source terminal of the transistor P2 is connected to the voltage supply line 10, and the P-well terminal of transistor P2 is connected to the P-source terminal. The N-drain terminal of the transistor N2 connects to the P-gate of transistor P2, and the N-source terminal of transistor N2 connects to ground 20, which may serve as a voltage reference line. The N-gate terminal of transistor N2 connects to the node 18, which is the P-drain terminal of transistor P2, and the N-well terminal of transistor N2 connects to the N-source terminal of transistor N2.

Immediately upon a positive ESD voltage zap appearing on voltage supply line 10, capacitor C2 acts as a short. The N-gate of transistor N2 is coupled to ground (i.e., a low condition), so transistor N2 does not conduct. The P-gate of transistor P2 is coupled to voltage supply line 10 through drain to gate parasitic capacitance CP, which, like capacitor C2, initially acts as a short so that transistor P2 is in an OFF state. Transistor P2, therefore, acts as a relatively large resistor, thereby increasing an effective RC delay. The voltage $V_{C2}$ couples to GND 20 in response to the positive ESD zap. $V_{C2}$ subsequently decays (in a positive direction) toward $V_{DD}$ with a time constant determined by a product of capacitor C2 and an effective resistance of the transistor P2. As the voltage $V_{C2}$ is effectively inverted with respect to the voltage $V_{del}$ in, for example, FIG. 2, an inverter 19 may be employed to shape and invert $V_{C2}$ to generate an output voltage $V_{del}$ on output line 15 that may trigger the ESD protection circuit 50.

In normal operation, capacitor C2 is open, the P-gate of transistor P2 is floating, but the P-well of transistor P2 is at $V_{DD}$ (i.e., a high condition), so transistor P2 is in an ON state and the capacitor voltage $V_{c2}$ is charged to $V_{DD}$. The N-gate of transistor N2 is also at $V_{DD}$, so transistor N2 is ON, and the P-gate of transistor P2 is pulled to ground.

The RC delay circuit 45 of FIG. 9 may be used to replace the RC circuit 40 of FIGS. 6, 7 and 8 with the same RC delay as with the embodiment of FIG. 2, although the voltage $V_{C2}$ in FIG. 9 is effectively inverted relative to $V_{del}$ in FIG. 2. The inverter 19 therefore may be used to invert the polarity of $V_{C2}$ at the node 18 to produce $V_{del}$ in the embodiment of FIG. 9.

Figure 10A:
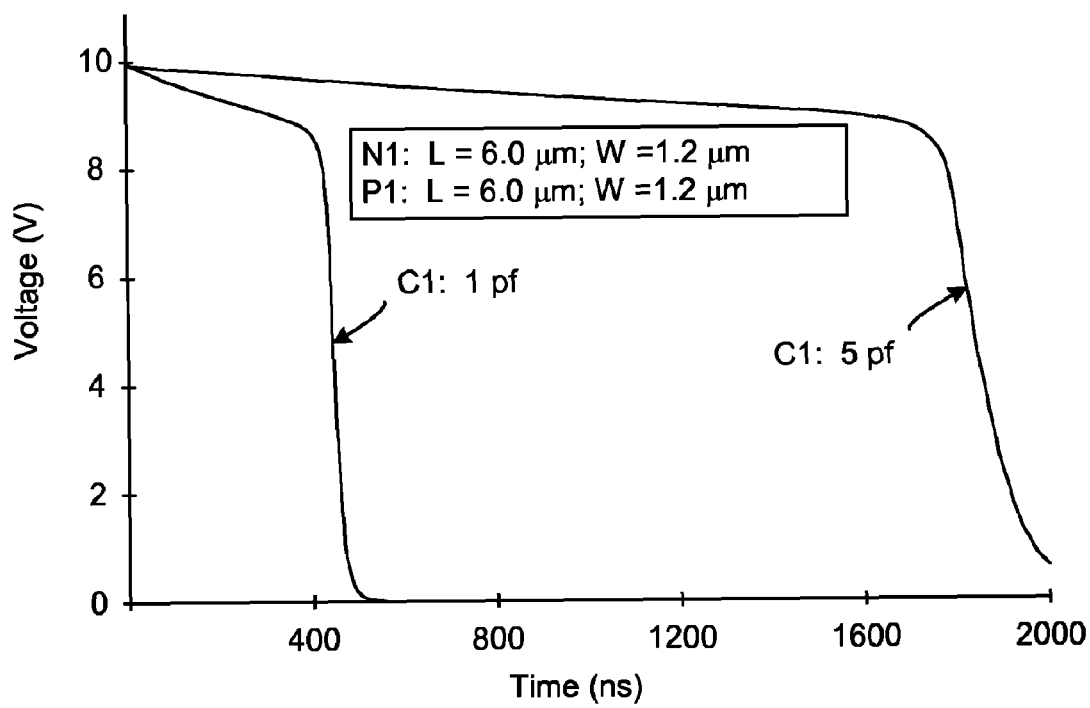
FIG. 10A is a chart illustrating an effect of capacitor size on performance of the embodiment of FIG. 6 for one set of transistor parameters.
Figure 10B:
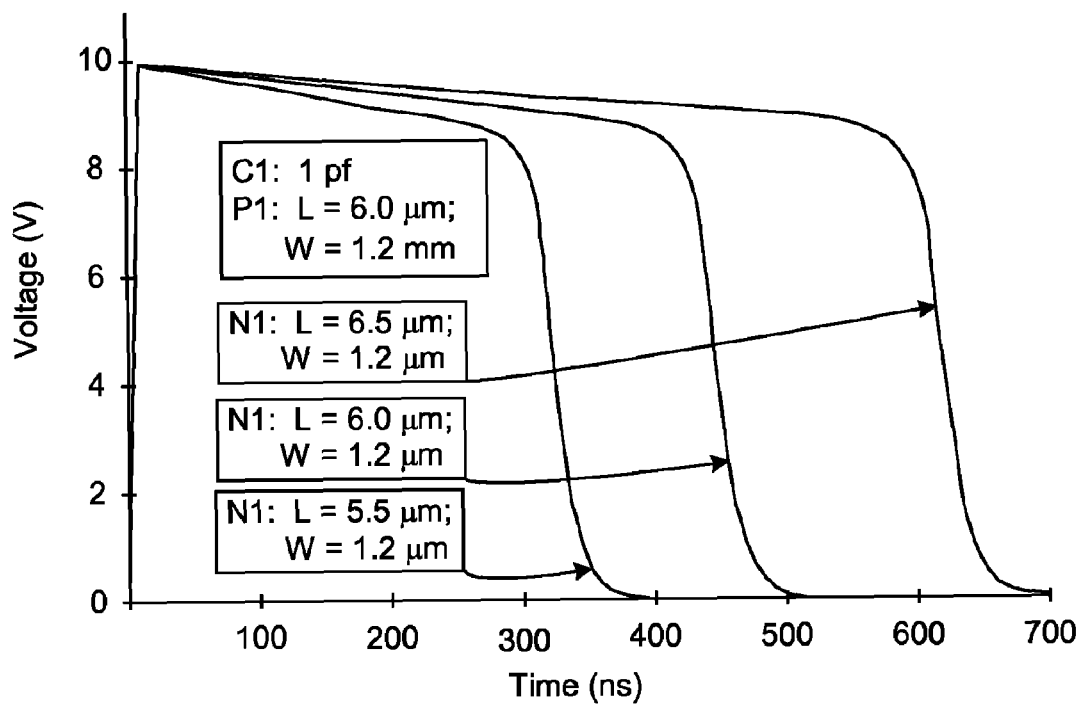
FIG. 10B illustrates in chart form an effect on performance of variations in transistor parameters for one capacitor size in the embodiment of FIG. 6.
Figure 10C:
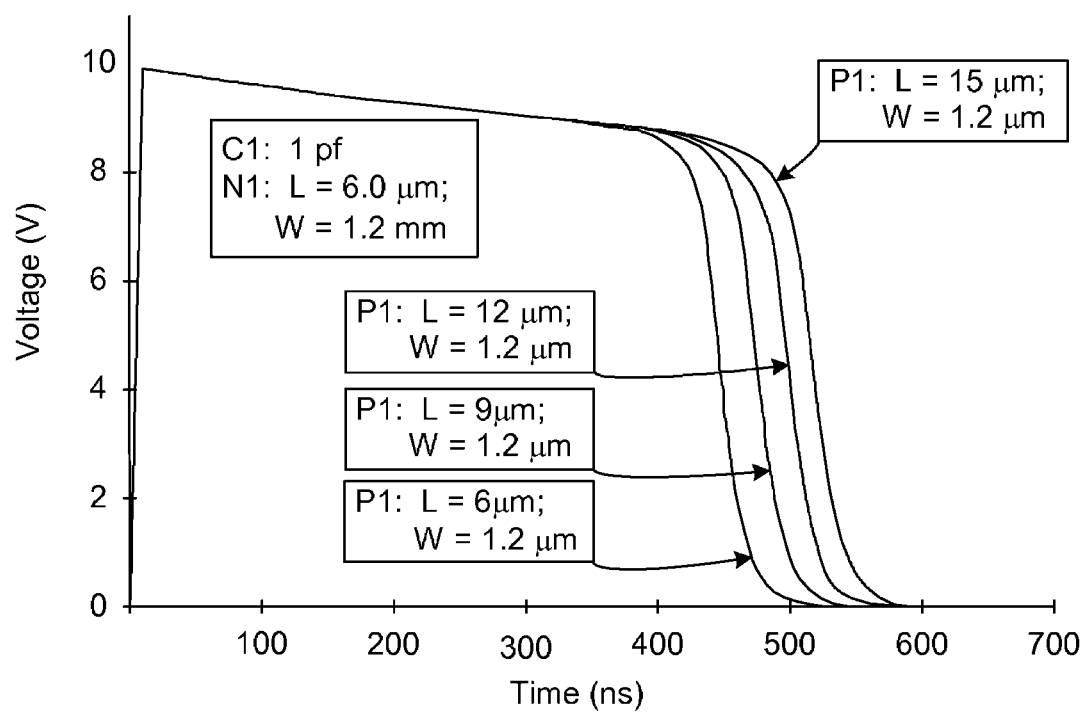
FIG. 10C is a chart illustrating performance of the embodiment of FIG. 6 for another set of transistor parameter variations.

FIGS. 10A-10C are charts that illustrate, in a manner similar to that of FIGS. 5B-5C and Table 1 above, effects of parametric variations in, for example, the delay circuit 40 of FIG. 6. In the chart of FIG. 10A, transistor parameters are fixed, and an effect of varying capacitor C1 can be noted. When C1 has a value of 1 pf, the delay approximates 400 ns; when C1 has a value of 5 pf, the delay is about 1800 ns. In FIG. 10B, three curves are shown that illustrate effects of varying parameters of transistor N1 in FIG. 6. Changes of 1 µm in a length of the transistor N1 from 5.5 µm to 6.5 µm can be seen to cause the delay to vary from about 300 ns to about 600 ns. Similar kinds of effects may be observed in FIG. 10C, which illustrates effects of varying a length parameter of transistor P1 in FIG. 6. RC delay varies from about 450 ns to about 500 ns when the length of P1 is varied from 6 µm to 15 µm. These examples and the examples described above relative to FIGS. 5B-5C and Table 1 demonstrate that the embodiments of apparatus and methods described herein can provide significant improvements in RC delay of ESD protectors while being efficient in the use of integrated circuit chip area.

In view of the foregoing, it will be understood by those skilled in the art that the methods of the present invention can facilitate formation of ESD protection structures in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A delay circuit for an electrostatic discharge (ESD) protector, comprising:
   a capacitor having a terminal connected to a node and another terminal connected to another node;
   a first transistor having a drain terminal connected to the node; and
   a second transistor having a drain terminal connected to a gate terminal of the first transistor only and a gate terminal connected to the node.

2. The delay circuit as set forth in claim 1, wherein:
   the terminal of the capacitor is a second terminal;
   the capacitor further comprises a first terminal connected to a voltage supply line;
   the first transistor comprises a source terminal connected to a reference voltage line;
   the second transistor comprises a source terminal connected to the voltage supply line; and
   the node is connected to an output voltage line.

3. A delay circuit for an electrostatic discharge (ESD) protector, comprising:
   a capacitor having a terminal connected to a node;
   a first transistor comprising a source terminal connected to a reference voltage line and a drain terminal connected to the node, and a second transistor having a drain terminal connected to a gate terminal of the first transistor and a gate terminal connected to the node, the delay circuit being arranged, configured and operational according to the following during normal operation:
   the second transistor being in an ON state;
   the first transistor being in an ON state;
   a voltage on the source of the second transistor being about equal to the voltage of a voltage supply line; and
   a voltage on the node being about zero.

4. A delay circuit for an electrostatic discharge (ESD) protector, comprising:
   a capacitor having a terminal connected to a node;
   a first transistor comprising a source terminal connected to a reference voltage line and a drain terminal connected to the node, and a second transistor comprising a source terminal connected to a voltage supply line and a drain terminal connected to a gate terminal of the first transistor and a gate terminal connected to the node, the delay circuit being arranged, configured and operational according to the following when an ESD voltage zaps the voltage supply line:

the gate of the second transistor being momentarily coupled to the voltage supply line, and the second transistor being turned OFF;

the gate of the first transistor floating, thereby increasing an effective resistance between the drain and source terminals of the first transistor; and a trigger signal being generated on the node relative to the voltage reference line, the trigger signal having an approximate form of a decaying exponential function with a time constant equal to a product of the capacitance of the capacitor and the effective resistance of the first transistor.

5. The delay circuit as set forth in claim 4, wherein the delay circuit comprises a communication path and is configured to input the trigger signal via the path to a PAD protection circuit.

6. The delay circuit as set forth in claim 4, wherein the delay circuit comprises a communication path and is configured to input the trigger signal via the path to a power/ground N-channel Metal-Oxide-Semiconductor (NMOS) electrostatic discharge protection circuit.

7. The delay circuit as set forth in claim 4, wherein the trigger signal is coupled through an even number of inverters to an input of an NMOS substrate pump electrostatic discharge protection circuit.

8. The delay circuit as set forth in claim 1; wherein:
the second transistor has a source terminal connected to the other node;
the first transistor is an N-channel Metal-Oxide-Semiconductor (NMOS) transistor formed in a substrate connected to the source terminal of the first transistor; and
the second transistor is a P-channel Metal-Oxide-Semiconductor (PMOS) transistor formed in a substrate connected to a source terminal of the second transistor.

9. A delay circuit for an electrostatic discharge (ESD) protector, comprising:
a capacitor having a terminal connected to a node;
a first transistor having a source terminal connected to a voltage supply line and a drain terminal connected to the node;
second transistor having a source terminal connected to a reference voltage line, a gate terminal connected to the node and a drain terminal connected to a gate terminal of the first transistor, the terminal of the capacitor comprising a second terminal and the capacitor further comprising a first terminal connected to the reference voltage line;
an inverter having an input terminal connected to the node and an output terminal connected to an output voltage line that is coupled to provide a signal to the ESD protection circuit.

10. The delay circuit as set forth in claim 9, wherein immediately after an ESD voltage zaps the voltage supply line the delay circuit is arranged, configured and operational according to the following:
the second transistor is in an OFF state;
the first transistor is in an OFF state with an effective resistance between the source and drain terminals thereof; and
a voltage at the input terminal of the inverter relative to the voltage on the reference voltage line is an approximate decaying exponential with a time constant determined by a product of the capacitance of the capacitor and the effective resistance of the first transistor.

11. The delay circuit as set forth in claim 10, wherein the output voltage line is coupled to the ESD protection circuit and the signal on the output voltage line triggers the ESD protection circuit.

12. An integrated circuit, comprising the delay circuit as set forth in claim 1 and an electrostatic discharge (ESD) protector coupled to receive a signal from the node.

13. The integrated circuit as set forth in claim 12, wherein:
the terminal of the capacitor is a second terminal;
the capacitor further comprises a first terminal connected to a voltage supply line;
the first transistor comprises a source terminal connected to a reference voltage line;
the second transistor comprises a source terminal connected to the voltage supply line; and
the node is connected to an output voltage line.

14. An integrated circuit, comprising the delay circuit as set forth in claim 9 and an electrostatic discharge (ESD) protector coupled to receive a signal from the node.

15. The delay circuit as set forth in claim 14, the first transistor having a source terminal connected to the voltage supply line, the second transistor having a source terminal connected to a reference voltage line, the terminal of the capacitor comprising a second terminal and the capacitor further comprising a first terminal connected to the reference voltage line, and the delay circuit further comprising an inverter having an input terminal connected to the node and an output terminal connected to an output voltage line that is coupled to provide a signal to the ESD protection circuit.

16. A delay circuit arrangement, comprising:
a capacitor having a terminal connected to an output voltage line;
first and second transistors connected together by way of their drain and gate terminals, respectively, being connected to the output voltage line, the second transistor having a source terminal connected to the capacitor; and
an electrostatic discharge (ESD) protector coupled to the output voltage line.

17. The delay circuit arrangement as set forth in claim 16, wherein the electrostatic discharge (ESD) protector is coupled to the output voltage line through an inverter.

18. A method for providing electrostatic discharge (ESD) protection, comprising:
providing a capacitor, a first transistor, a second transistor, and an ESD protector;
coupling terminals of the capacitor with a drain terminal of the first transistor and a gate terminal of the second transistor together to form a node and with a source terminal of the second transistor;
connecting a gate terminal of the first transistor to a drain terminal of the second transistor, whereby the capacitor, the first transistor and second transistor are formed into a delay circuit; and
coupling the node of the delay circuit to the electrostatic discharge (ESD) protector.

19. The method as set forth in claim 18, the first transistor comprising a source terminal connected to a reference voltage line and the second transistor comprising a source terminal connected to a voltage supply line, wherein:
in normal operation (a) the first transistor is in an ON state, (b) a voltage on the gate of the second transistor is about equal to the voltage of the reference voltage line and (c) a voltage on the output voltage line is about zero; and
when an ESD voltage zaps the first voltage line (a) the gate of the second transistor is momentarily coupled to the first voltage line, and the second transistor is turned OFF, (b) the gate of the first transistor floats, thereby increasing an effective resistance between the drain and source terminals of the first transistor, and (c) a trigger signal is generated on the output voltage line relative to the voltage reference line, the trigger signal having an approximate form of a decaying exponential function with a time constant equal to a product of the capacitance of the capacitor and the effective resistance of the first transistor.

20. The method as set forth in claim 18, the first transistor having a source terminal connected to the voltage supply line, the second transistor having a source terminal connected to a reference voltage line, the terminal of the capacitor comprising a second terminal and the capacitor further comprising a first terminal connected to the reference voltage line, and the delay circuit further comprising an inverter having an input terminal connected to the node and an output terminal connected to an output voltage line that is coupled to provide a signal to the ESD protection circuit, wherein immediately after an ESD voltage zaps the voltage supply line:
- the second transistor is in an OFF state;
- the first transistor is in an OFF state with an effective resistance between the source and drain terminals thereof; and
- a voltage at the input terminal of the inverter relative to the voltage on the reference voltage line is an approximate decaying exponential with a time constant determined by a product of the capacitance of the capacitor and the effective resistance of the first transistor.

* * * * *